United States Patent [19]

Briffod et al.

[11] Patent Number: 5,726,412
[45] Date of Patent: Mar. 10, 1998

[54] LINEAR MICROWAVE SOURCE FOR PLASMA SURFACE TREATMENT

[75] Inventors: Georges Briffod, Seyssins; Nguyen Trong Khoi, Saint Egieve, both of France

[73] Assignee: Commissariat A L'Energie Atomique, Paris, France

[21] Appl. No.: 507,249

[22] PCT Filed: Feb. 17, 1994

[86] PCT No.: PCT/FR94/00179

§ 371 Date: Oct. 3, 1995

§ 102(e) Date: Oct. 3, 1995

[87] PCT Pub. No.: WO94/19921

PCT Pub. Date: Sep. 1, 1994

[30] Foreign Application Priority Data

Feb. 18, 1993 [FR] France ................... 93 01847

[51] Int. Cl.⁶ ........................................ B23K 10/00
[52] U.S. Cl. .................. 219/121.43; 219/121.42; 219/123; 315/111.41; 204/298.16
[58] Field of Search ............... 219/121.4, 121.43, 219/121.44, 123, 121.36; 204/298.37, 298.38, 192.11, 298.16; 156/345; 315/111.21, 111.51, 111.41

[56] References Cited

U.S. PATENT DOCUMENTS

| 4,767,931 | 8/1988 | Sato et al. | |
| 4,876,983 | 10/1989 | Fukuda et al. | 118/722 |
| 5,022,977 | 6/1991 | Matsuoka et al. | 204/298.16 |
| 5,198,725 | 3/1993 | Chen et al. | 315/111.41 |
| 5,302,266 | 4/1994 | Grabarz et al. | 204/192.12 |
| 5,399,830 | 3/1995 | Maruyama | 219/121.43 |

FOREIGN PATENT DOCUMENTS

| 0 252 845 | 1/1988 | European Pat. Off. |
| A 62140339 | 6/1987 | Japan . |
| A 63172429 | 7/1988 | Japan . |
| A 1254245 | 10/1989 | Japan . |
| WO 92/21136 | 11/1992 | WIPO . |

OTHER PUBLICATIONS

Gormezano et al., "Lower-Hybrid Plasma Heating Via A New Launcher—The Multijunction Grill," *Nuclear Fusion*, Vo. 25, No. 4 (1985) pp. 419–423.

The Patent Office Japanese Government, "Patent Abstracts Of Japan," vol. 10, No. 158 (E-409) [2214] 126 (1986).

Jiang et al., "Real Plasma Effects Of Microwave RAdiation Propagating Perpendicular To A Magnetized Plasma," *IEEE Nuclear and Plasma Sciences Society*, Catalog No. 89CH2760-7 (1989) pp. 145–146.

*Primary Examiner*—Mark H. Paschall
*Attorney, Agent, or Firm*—Burns, Doane, Swecker & Mathis

[57] ABSTRACT

The invention relates to a linear microwave source for the treatment of surfaces comprising:

- a tight enclosure (1),
- means ($B_1$, $B_2$; $A_1$, $A_2$) for producing a magnetic field in the enclosure and for generating a plasma layer (P),
- coupling means between the microwave emission means and the enclosure (1),
- at least one target (2),
- pumping means (3),
- gas injection means (9) for checking the ion species of the plasma layer (P).

Particular application to plasma surface treatment.

19 Claims, 7 Drawing Sheets

LINEAR MICROWAVE SOURCE FOR PLASMA SURFACE TREATMENT

TECHNICAL FIELD

The present invention relates to a linear microwave source for plasma surface treatment.

PRIOR ART

In electron cyclotron resonance sources, the ions are obtained by ionizing, within a sealed enclosure of the superhigh frequency cavity type and having an axis of symmetry, a gaseous medium constituted by one or more gases or metal vapours. This ionization results from an interaction between the gaseous medium and a plasma of electrons highly accelerated by electron cyclotron resonance. This resonance is obtained by means of the combined action of a high frequency electromagnetic field injected at a first end of the enclosure and a magnetic field having an axial symmetry prevailing in said same enclosure.

French patent application 86 10066 of Jul. 10, 1986 describes such a cyclotron resonance ion source having:
- a sealed enclosure with a longitudinal axis of symmetry, a first and a second ends oriented in accordance with said axis, said enclosure containing a gas for forming by cyclotron resonance a plasma confined within said enclosure;
- a device for injecting at the first end of the enclosure a high frequency electromagnetic field;
- a magnetic structure arranged around the enclosure and having an axis of symmetry coinciding with that of the enclosure, producing axial and radial, local magnetic fields, defining at least one equimagnetic layer on which the electron cyclotron resonance condition is satisfied, said magnetic structure comprising:
  - a first and a second coils positioned on either side and equidistantly with respect to a median plane, perpendicular to the longitudinal axis of the enclosure and passing through the centre of the cavity, said two coils being traversed by currents having opposing flow directions and
  - means for concentrating magnetic force lines surrounding the enclosure in the median plane and locally reinforcing the radial magnetic fields in said plane;
- a system for extracting from the enclosure the ions formed and located at the second end of the enclosure.

Several other prior art documents relate to plasma sources.

Patent application WO-A-92/21136 (Material Research Co.) describes an apparatus for the treatment of electronic "wafers" having the following features:
- the device revolves about an axis,
- the microwave power is applied by a cylindrical cavity excited by an array of distributed loops,
- the magnetic field is produced by distributed magnets, said field having a symmetry of revolution and being highly inhomogeneous,
- for compensating said inhomogeneity of the field and the plasma the magnets rotate.

Such a source with a revolution geometry cannot be transposed to a linear geometry.

Japanese abstract (Vol. 10, no. 158, 6.6.1986; JP-A-61-013 634) describes a device whose magnetic configuration is of revolution.

The configuration of the cusp is that used in fusion machines. The cusp configuration is used for eliminating in the radial direction high energy particles, which can cause defects in the deposition. In said configuration the cusp is not an active element.

Patent application EP-A-252,845 (CEA) describes an electron cyclotron resonance ion source. This source has an enclosure containing a gas for forming a confined plasma, a device for injecting at one end of the enclosure a hf electromagnetic field, two coils arranged around the enclosure and supplied in opposition, located on either side of a median plane perpendicular to the longitudinal axis of the enclosure, a ring-shaped, soft iron shield surrounding the enclosure and located in the median plane, the coils and the shield defining at least one equimagnetic layer on which the electron cyclotron resonance condition is satisfied, as well as a system for extracting the ions formed and located at the second end of the enclosure.

Several prior art documents deal with couplers:

The article entitled "Lower-hybrid plasma heating via a new launchers—The multijunction grill" by Gormezano et al (Nuclear Fusion, vol. 25, No. 4, 1985, Vienna, Austria, pp. 419–423).

The article entitled: "Coupling of slow waves near the lower hybrid frequency in JET" by Litaudon et al (Nuclear Fusion, vol. 30, no. 3, 1990, Vienna, Austria, pp. 471–484).

The article entitled: "A 4 waveguide multijunction antenna for L. H. H. in PETULA" by N'Guyen et al (Proceedings of the 13th symposium on fusion technology, vol. 1, 24–28 Sep. 1984, Varese Italy, pp. 663–668).

The article entitled: "The 15 Mw microwave generator and launcher of the lower hybrid current drive experiment on JET" by Pain et al (Proceedings of the IEEE 13th symposium on fusion engineering, 2–6 Oct. 1989, vol. 2, Knoxville, USA, pp. 1083–1088).

The article entitled: "First operation of multijunction launcher on JT-60" by Ikeda et al (Proceedings of the 8th topical conference on radiofrequency power in plasmas, 1–3 May 1989, no. 190, Irvin, Canada, pp. 138–141).

The article entitled: "Technological developments in lower hybrid coupling structures in FT and FTU" by Ferro et al (Proceedings of the 11th symposium on fusion engineering, 18–22 Nov. 1985, vol. 2, Austin, Tex., pp. 1210–1213).

U.S. Pat. No. 4,110,595 (Brambilla et al).

In all these documents the aim is to slow down a wave. This is brought about by associating guides by the large side and imposing a regular phase shift $\Delta \psi$ between each guide. The coupling of the wave is obtained by placing said array of guides perpendicular to the magnetic field.

In all these documents there is a superimposing of independent VHF modules in order to make available the maximum power in the surface of a fusion machine (JET, JT 60, TORE SUPRA). These guides are associated in each module by the large side and are perpendicular to the magnetic field.

However, the field of the present invention is the production of very long plasma layers (e.g. exceeding 1 meter) and coupling a microwave power with said plasma layer with a view to the treatment of large surfaces.

To this end, the invention aims at solving a certain number of problems existing in the prior art devices, in order to reduce costs, facilitate use and obtain better results, in particular:
- producing a planar magnetic configuration, whose plane of symmetry is identical to that of the plasma layer,
- production over the entire width of the plasma layer of a constant magnetic field making it possible to obtain the resonance condition between the frequency of the wave and the electron cyclotron frequency over the entire width of said layer, possibility of varying the magnetic configuration in order to adapt the characteristics of the plasma to the chosen surface treatment type, use of the coupler ensuring a uniform distribution of the microwave power over the plasma layer and a wave plane perpendicular to the magnetic field, desired modularity of the source, obtaining homogeneous target wear, obtaining a good adaptation of the different elements used: coupler, plasma, target, to the desired deposit, obtaining a good operation despite the large dimensions of the installations, obtaining a controlled deposit independently of the formation of the plasma layer.

DESCRIPTION OF THE INVENTION

The invention proposes a linear microwave source functioning without an electrode, in a wide pressure range and generating a plasma layer whose dimensions are adapted to the treatment of large surfaces.

This linear microwave source for the plasma treatment of surfaces is characterized by the implementation of:

a tight enclosure, an array of coils and/or magnets making it possible to generate planar magnetic configurations, whose plane of symmetry corresponds to that of the plasma layer, coupling means between the microwave power sources and the plasma layer in the enclosure, at least one target, constituted by at least one element to be deposited, which is electrically insulated from the enclosure and raised to a bias voltage relative to the plasma layer, pumping means for producing the vacuum in the enclosure, gas injection means for checking the ion species of the plasma layer, a magnetic field having a plane of symmetry coinciding with that of the plasma layer and that of the enclosure, a constant magnetic field in the direction of the plasma layer width, which makes it possible to obtain the resonance condition $2\pi f_0 = e\, B_{RES}/m$ over the entire plasma layer width.

Apart from the advantage of functioning without an electrode in a wide pressure range and generating a plasma layer whose dimensions are adaptable to the application adopted, the microwave source according to the invention can, as a function of the arrangement of the coils and permanent magnets, function with several magnetic configuration types:

a planar configuration of the "magnetic mirror" type making it possible to produce a very dense plasma layer and an ion flux, whose characteristics are particularly appropriate to a process for the coating of large parts by target sputtering;

a planar configuration of the "magnetic cusp" type appropriate for the production of a metallic plasma layer for depositing thin metallic or alloy films on substrates;

a planar configuration of the "hybrid" type favouring the production of multicharged ions for the requirements of ion implantation on large surfaces.

The coupling of the microwave power with the plasma layer is brought about by waveguides associated or joined along their large or small sides, permitting a uniform distribution of said power over the entire plasma layer and the excitation of a wave or vibration plane perpendicular to the magnetic field.

In a preferred embodiment the coupler is constituted by identical VHF modules, each module grouping several guides joined along the large side and supplied from a main guide by means of a planar multijunction E or several secondary guides joined along the small side and supplied from a main guide by means of a taper E and H and a mode converter. At a frequency of 2.45 GHz, this solution is particularly simple and economic, because each VHF module can be supplied by a magnetron-type, medium power, microwave emitter or transmitter.

This method of associating or joining guides makes it possible to adapt the surface of the plasma layer generated in the source to the dimensions of the parts to be treated and in particular to large parts.

Advantageously the coupling means are at least partly made from a material which is that of the target, which makes it possible to obtain high quality metal deposits, contamination by impurities then being reduced. The source assembly is grounded or earthed. The enclosure has a parallelepipedic shape. The frequency of the electromagnetic field produced within the enclosure is in the range 1 to 10 GHz.

In a first variant, the means for producing a magnetic field comprise coils, the length of the coils exceeding the length of the vacuum enclosure, so as to eliminate the edge effects linked with the return of the current.

In a second variant, the means for producing a magnetic field comprise permanent magnet blocks located on either side of the vacuum enclosure, the permanent magnet blocks being extended beyond the vacuum enclosure in order to prevent edge effects.

In a first embodiment, the source according to the invention has a mirror-type magnetic configuration comprising two identical coil arrays traversed by equal currents flowing in the same direction, or two identical magnet blocks hollowed out in their central portion and located on either side of the vacuum enclosure, the magnetic field having two maxima $B_{MAX}$ and one minimum $B_{MIN}$ between said maxima, the condition $B_{MAX} > B_{RES} > B_{MIN}$ being satisfied over the entire width of the plasma layer, $B_{RES}$ being the value of the magnetic field for which the cyclotron angular frequency of the electron is equal to the angular frequency of the electromagnetic wave used for producing the plasma.

Compared with the magnetron method currently used for this coating process, this type of source offers numerous advantages. The ionization of the gas, the sputtering of the target, the recombination of the target atoms on the part to be treated are very strongly decoupled, which gives a very considerable flexibility in the performance of the process. The ion density $n_i$ in the source is fixed by the gas flow rate $\Gamma o$ and the microwave power $P_{VHF}$ and the velocity of the ions $V_2$, which bombard the target by the voltage of said target $V_c$. The deposition rate on the part, which is proportional to the ion flux on the target, can thus be controlled in independent manner by the three parameters $\Gamma o$, $P_{VHF}$ and $V_c$. This e.g. makes it possible to optimize the coefficient of sputtering of ions on the target by the target $V_c$ and optimize the density in the source $n_i$ with the parameters $\Gamma o$ and $P_{VHF}$. Moreover, in said sources the neutral atoms emitted by the target recombine on the part to be treated in a region which does not face the plasma. Thus, for a constant ion flux supplied by the source, the pressure in the work frame or rack can be lowered by using a differential pumping. The wave ionization mechanism used enables the ion flux given to the target to operate with lower pressures in the source, which limits the density of occluded gases in the deposit. The material balance is improved because the entire surface of the target is bombarded by the plasma layer. In addition, the target can be charged without dismantling the source or passing in front of the ion beam for carrying out a continuous process.

In this embodiment the source can be used for supplying a beam of ions or electrons.

For this embodiment the target is replaced by extraction electrodes. The first electrode facing the plasma layer is placed at the potential of the vacuum enclosure and the second electrode is positively polarized in order to extract the electrons or negatively polarized to extract the ions.

In a second embodiment the source according to the invention has a magnetic cusp configuration in which the currents passing through the coils or magnetization vector in the magnet blocks have opposite signs, the coils and the magnets being dimensioned so as to satisfy the condition $B_{xMAX}$, $B_{yMAX} > B_{RES}$ over the entire plasma layer width.

Apart from the possibility of producing deposits on large substrates, by its very operating principle this type of source has, compared with the generally used sources, a number of important advantages. The wave ionization mechanism eliminates pollution of the deposit linked with the use of an emissive cathode and permits an operation of the source at low pressure, which limits the density of the occluded gases. The magnetic cusp configuration offers a new possibility of checking the nature and quality of the deposit. The latter point is important with respect to the flexibility of use of such sources.

In a third embodiment, the source according to the invention has a hybrid magnetic configuration generated by the superimposing of a mirror-type magnetic field produced by two coils surrounding the vacuum enclosure and a transverse magnetic field produced by two permanent magnet blocks located on either side of the vacuum enclosure.

The advantage of this configuration is that it generates a planar surface in the plasma, where the resonance condition $|B|=B_{RES}$ is satisfied at all points of said surface. This property is essential for the formation of multicharged ions in the plasma.

The field of application of this type of source covers all the fields of application of conventional ion sources, namely ion implantation, deposition with ion assistance, etc. The unique advantage of this type of source is that it permits the performance of such processes on an industrial level as a result of the dimensions and performance characteristics of the generated ion beam.

In each of these embodiments, the absence of an emissive cathode makes it possible to enable the sources to operate with reactive gases under permanent conditions with a remarkable reliability and service life.

BRIEF DESCRIPTION OF THE DRAWINGS

FIGS. 8 to 8c illustrate a cusp source according to the invention in a configuration using permanent magnets.

DETAILED DESCRIPTION OF EMBODIMENTS

According to the invention specific properties of a plasma layer created in a cyclotron resonance ion source and the generation of a plasma, such as the density, ionization rate and dimensions are based on the simultaneous implementation of a linear magnetic configuration, the ionization of the gas by a wave of frequency $f_o$, the use of the resonant properties of said wave at the electron cyclotron resonance $f_o=f_{ce}=eB/m$ (e: electron charge; B magnetic field module, m electron mass) and the possibilities thereof of propagating at high density in the form of the lower hybrid mode and the uniform excitation of said wave throughout the plasma layer by means of a coupler constituted by identical, juxtaposed associated waveguides.

The magnetic configuration of such a source is produced by coils or permanent magnets. As a function of the direction and intensity of the current in the coils or the magnetization in the permanent magnets, it is possible to obtain three magnetic configuration classes:

a mirror-type magnetic configuration, a cusp-type magnetic configuration, a hybrid magnetic configuration.

These sources, as a function of the magnetic configuration used, generate a plasma, whose characteristics are specifically adapted to the requirements:

of coating by sputtering (first configuration), the deposition of thin metal layers (second configuration), ion assistance and implantation (third configuration).

In the following description, the frequency $f_o$ of the wave is not defined, because the source according to the invention operates in a wide frequency range between a few hundred megahertz (MHz) and a few dozen gigahertz (GHz). Within said range 1 to 10 GHz offers numerous advantages. Thus, power emitters exist, the performance characteristics of the permanent magnets are compatible with the resonance condition of the wave $f_o=eB/2\pi m$ and the characteristics of the plasma are adapted to the envisaged applications. In particular at the industrial frequency of 2.45 GHz, for which there are numerous small and medium power emitters of the magnetron type and high power emitters of the klystron type, there is a great flexibility in the distribution of said power over the guides of the coupler and a good compromise between the price of these sources and the performance characteristics of the plasma.

Figure 1:
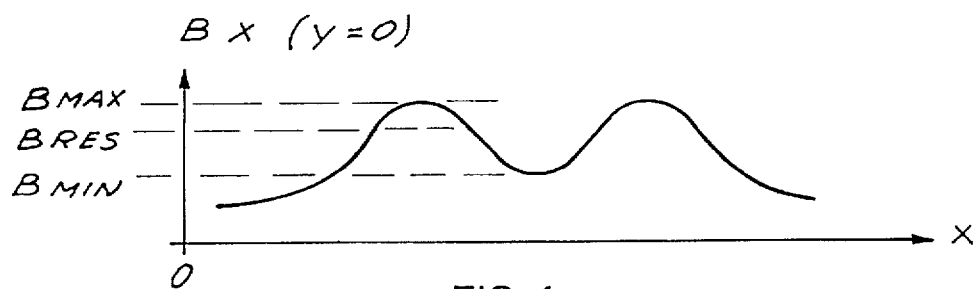
FIGS. 1a to 1c illustrate a magnetic mirror source according to the invention in a configuration using coils.
Figure 1:
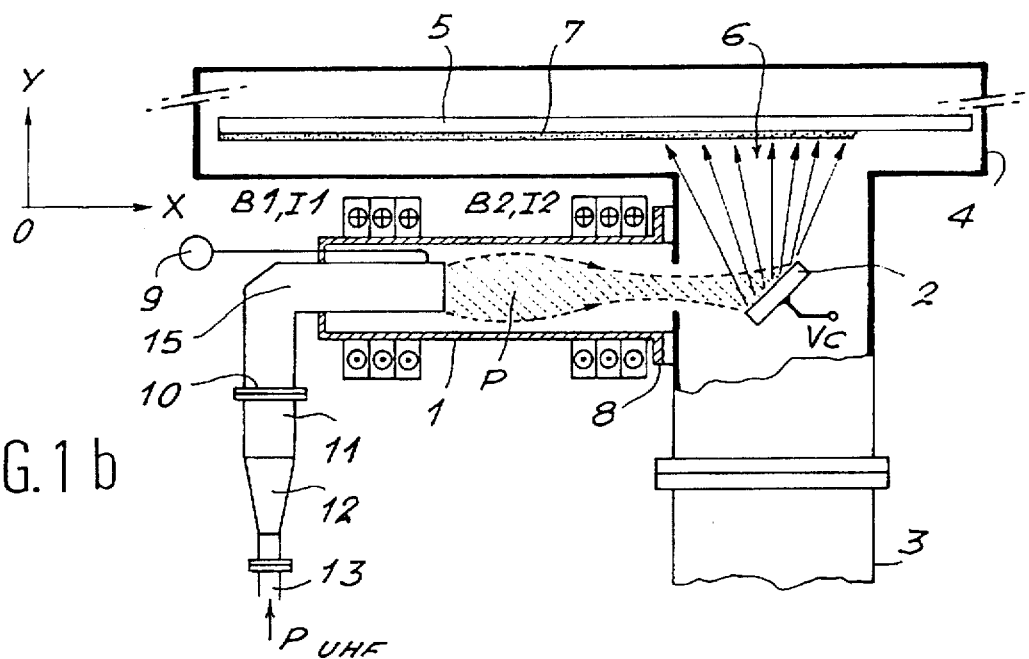
Figure 1:
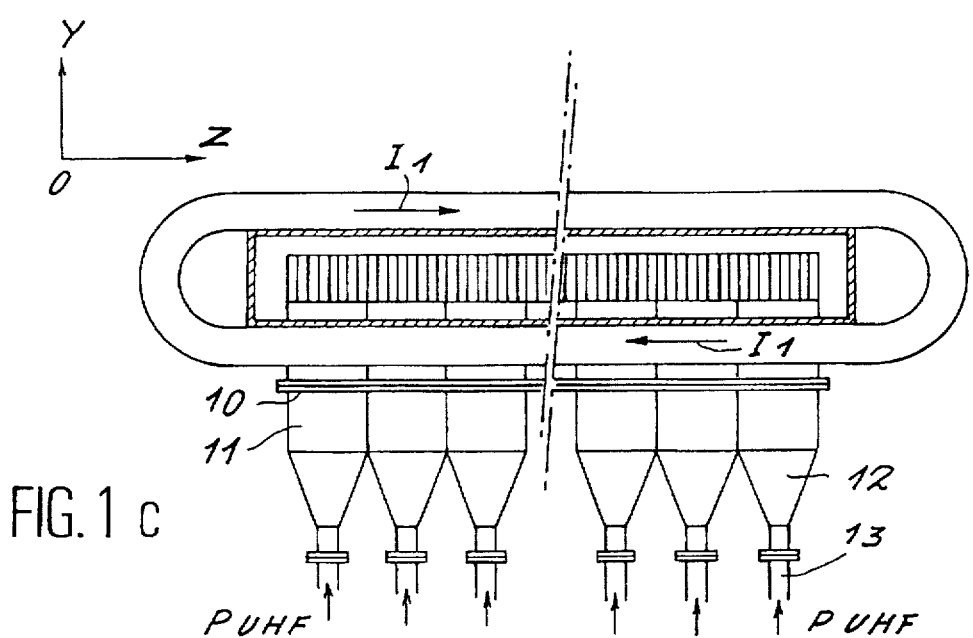
Figure 2:
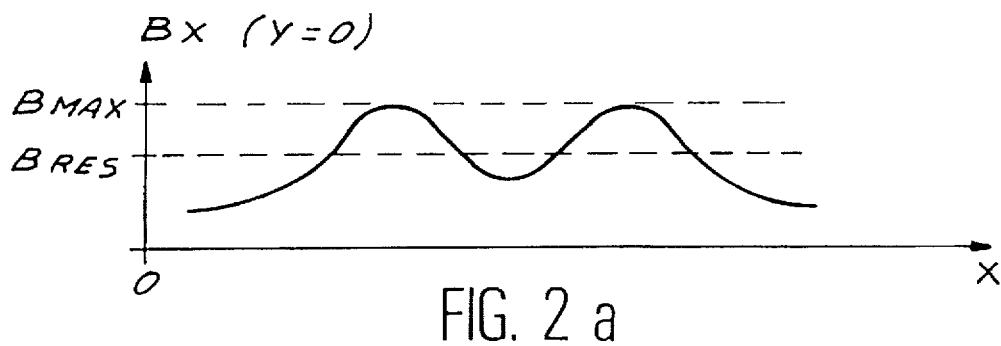
FIGS. 2a to 2c illustrate the magnetic mirror source according to the invention in a configuration using permanent magnets.
FIG. 2d illustrates a variant of the source according to FIGS. 2a to 2c.
Figure 2:
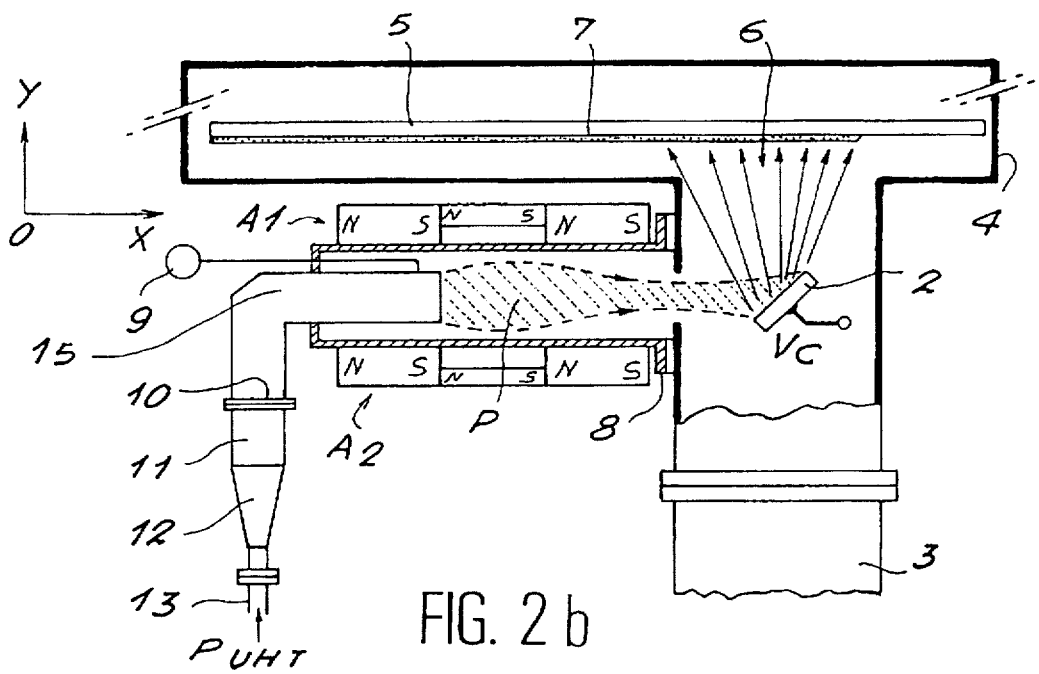
Figure 2:
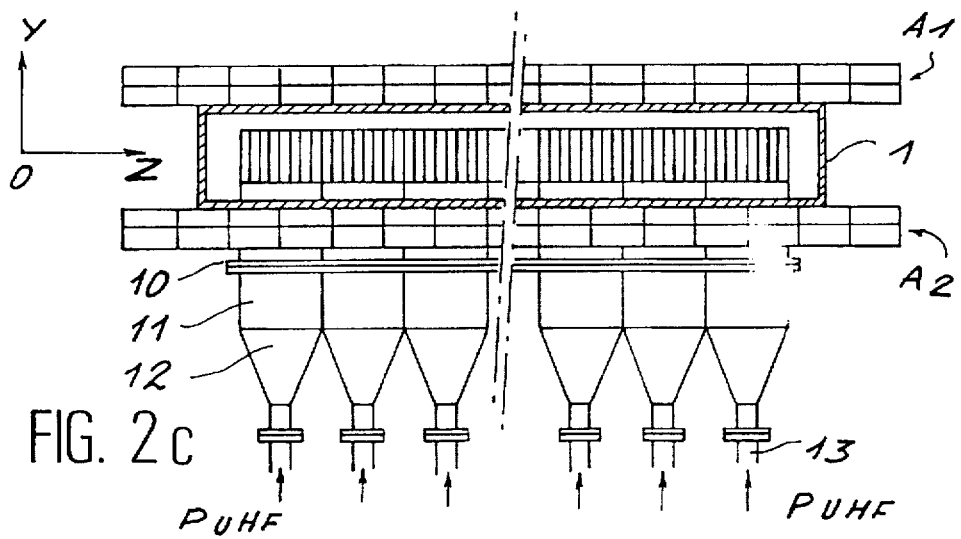

The basic circuit of a magnetic mirror-type source used for coating a part by sputtering a target 2 by ion bombardment is illustrated in FIGS. 1a to 1c and 2a to 2c. In FIGS. 1b and 1c the magnetic mirror is produced by coils $B_1$ and $B_2$ and in FIGS. 2b and 2c by permanent magnets $A_1$ and $A_2$. FIGS. 1a and 2a show the variation of the magnetic field Bx in the plane of symmetry of the source (Y=0). FIGS. 1b and 2b correspond to a section of the source in the form of a planar cross-section (xOy plane) and FIGS. 1c and 2c to a section according to a longitudinal cross-section (yOz plane). This source is constituted by a vacuum enclosure 1, an array of coils $B_1$, $B_2$ or permanent magnets $A_1$, $A_2$ creating the magnetic configuration and a coupler distributing within the enclosure the VHF power generated by the microwave emitter or emitters.

The vacuum enclosure 1 is parallelepipedic. The height of its cross-section (xOy plane; FIGS. 1b and 2b) is chosen so as to permit the passage of the waveguides of the coupler. The width is determined by the dimensions of the coils and the magnets. The length of its longitudinal cross-section (yOz plane) is only fixed by the size of the parts to be treated. The enclosure 1 is connected to the work frame or rack 4 by means of a clamp 8. As a function of the type of use, the vacuum in the enclosure is produced by an autonomous pumping unit or by the work frame pumping unit 3.

In FIGS. 1b and 1c, as well as 2b and 2c the coupler permitting the transfer of the microwave power $P_{VHF}$ to the plasma layer is constituted by guides associated or joined along the large side. In this case the guides are grouped by identical modules. Each VHF module is supplied by a main guide 13 via an adapter, a main guide/overdimensioned guide transition 12, a planar division E 11, a tight window 10 and several secondary guides 15. The association of these VHF modules makes it possible to adapt the size of the generated plasma layer to the size of the parts to be treated.

The coupler emits a plasma layer P in the direction of the target 2 polarized at voltage $V_c$. A flow 6 of neutral charges from the target is then emitted in the direction of the part 5 to be treated on which is produced a deposit 7.

The enclosure 1 is equipped with at least one gas injection system 9 for checking ion species of the plasma.

In the configuration shown in FIGS. 1b and 1c the magnetic field is produced by two coil arrays $B_1$ and $B_2$ traversed by currents $I_1$ and $I_2$ in the same direction. These coils surround the vacuum enclosure 1. Their length exceeds that of the enclosure in order to eliminate the edge effects linked with the return of the current. Under these conditions the vector potential A generated by these coils has a single component in the volume of the enclosure $A_z(x,y)$ and the two components of the magnetic field Bx and By are fixed by the relations $$B_x = \frac{\partial A_z}{\partial y} \text{ and } B_y = -\frac{\partial A_z}{\partial x}$$

For two identical coil arrays $B_1$ and $B_2$ traversed by identical currents $I_1$ and $I_2$ in the same direction, the magnetic field B in the plane of symmetry (y=0) has the conventional shape of so-called magnetic mirror fields used in revolution geometry fusion machines. This field has two maxima $B_{MAX}$ at the centre of the coils and one minimum $B_{MIN}$ between the coils. The shape of the coils, the distance separating them and the currents flowing through them are chosen so as to satisfy the condition $B_{MAX}>B_{RES}>B_{MIN}$ over the entire plasma layer width. $B_{RES}$ is the magnetic field value for which the cyclotron angular frequency of the electron $ce=eB_{RES}/m$ is equal to the angular frequency of the electromagnetic wave used for producing said plasma $\omega_o=2\pi f_o=e\ B_{RES}/m$.

The use of coils for generating the magnetic configuration has the advantage of a high source operating flexibility. Within the condition $B_{MAX}>B_{RES}>B_{MIN}$ the characteristics of the magnetic mirror can easily be modified by acting on the currents $I_1$ and $I_2$, the distance between the coils and the number of windings supplied in each coil.

Figure 3:
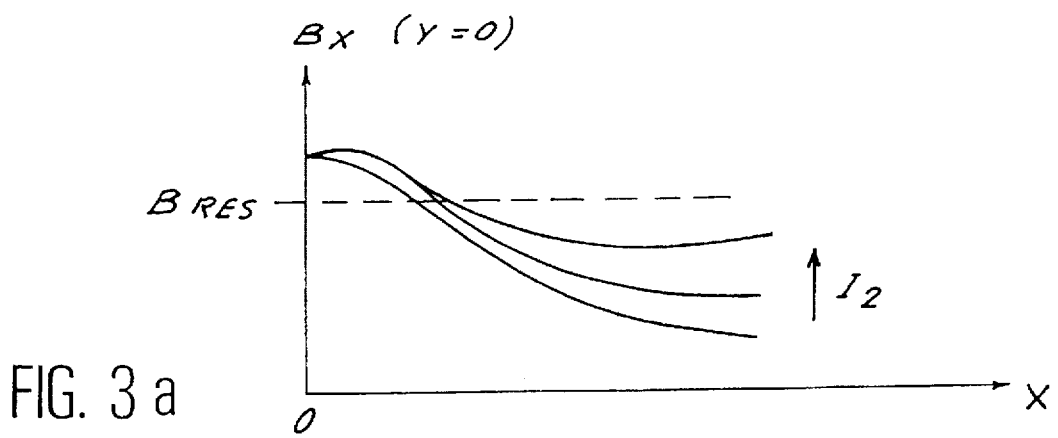
FIGS. 3a and 3b illustrate a variant of the source of FIGS. 1a and 1c.
Figure 3:
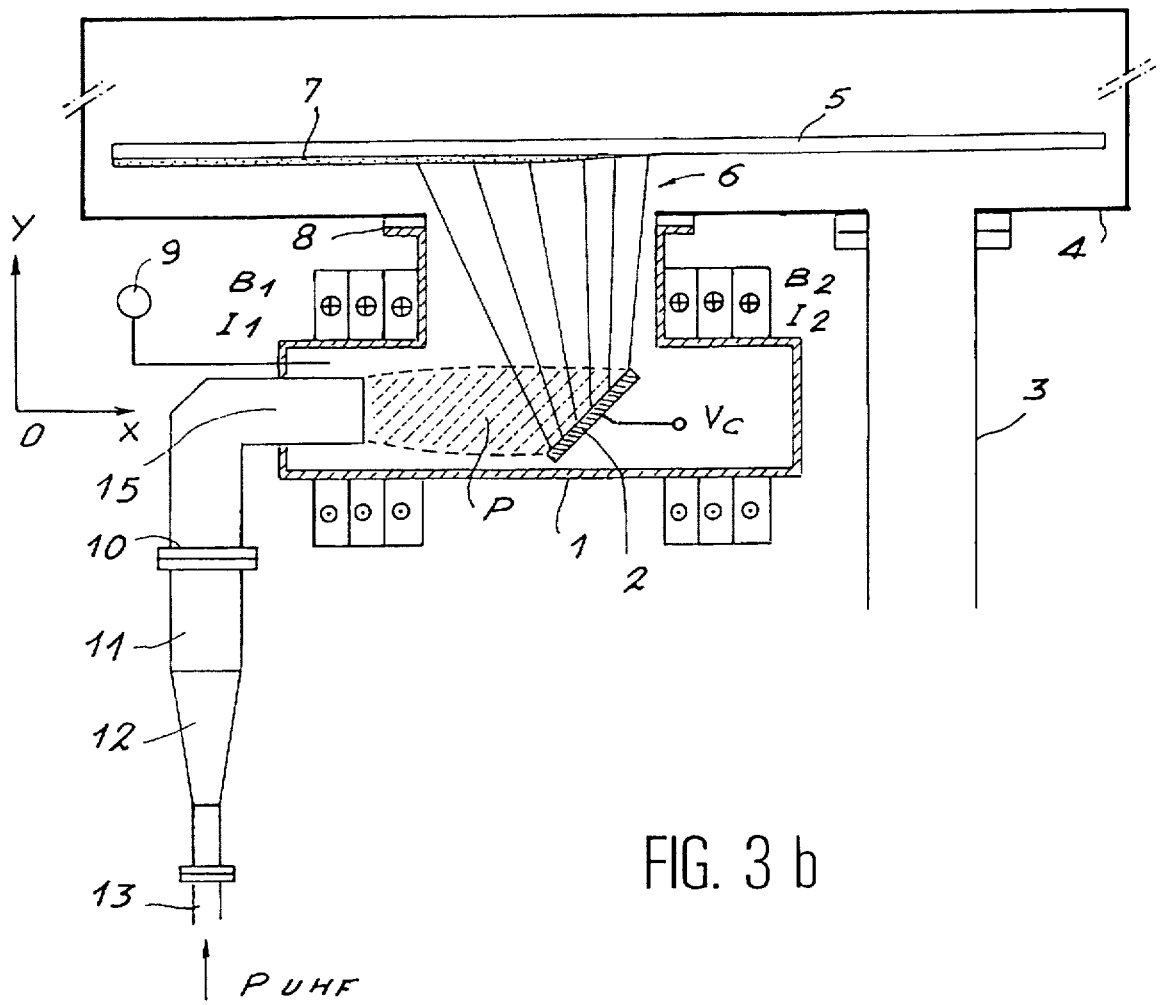

This in particular makes it possible to adjust the position of the cyclotron resonance ($B_{RES}$) in the mirror and with respect to the coupler in order to optimize the characteristics of the plasma (density, electron temperature, working pressure), modify the mirror ratio in order to act on the leakage flux of the plasma on the extraction side or check the impact surface of the plasma on the target. FIGS. 3a and 3b illustrate a variant of the source according to FIGS. 1a to 1c with an asymmetrical magnetic mirror. In this case the target is moved closer to the coupler and positioned between the coils $B_1$ and $B_2$. According to the adopted sputtering deposition process, this source operating variant is of interest, because it makes it possible to very easily vary, by acting on the current $I_2$, the density of the ion flux bombarding the target. It also makes it possible to adjust the magnetic field gradient $2B/2_x$ to the frequency of the wave used.

Figure 4:
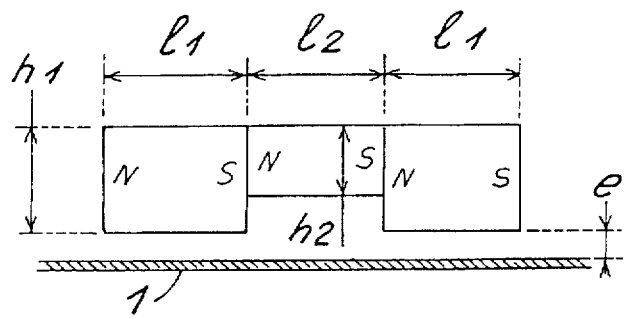
FIGS. 4 to 6 illustrate different characteristics of the source according to the invention.

A linear configuration with a magnetic mirror like that shown in FIGS. 1b and 1c can be obtained on the basis of samarium-cobalt or iron-neodymium-boron, parallelepipedic permanent magnets. These magnets are assembled to form two identical blocks $A_1$ and $A_2$ arranged on either side of the vacuum enclosure, as shown in FIG. 2b. In the longitudinal direction (Oz), said blocks are extended beyond the vacuum enclosure to avoid edge effects, as shown in FIG. 2c. These two magnet blocks $A_1$ and $A_2$ are hollowed out in the central portion. The characteristics of the magnetic mirror ($B_{MAX}$, $B_{MIN}$, mirror length and ratio) are fixed by the widths and heights of the two external blocks of the mirror $l_1$ and $h_1$ and the central block $l_2$ and $h_2$, as shown in FIG. 4.

Within the condition $B_{MAX}>B_{RES}>B_{MIN}$, the characteristics of the mirror can be adjusted by acting on the distance between the magnet and the enclosure e, on the gaps between the magnet blocks, or by supplying metal parts, which are arranged in known manner for the purpose of modifying the magnetic field lines.

The great advantage of using magnets is to produce a magnetic configuration without an electric power source. As the microwave power is transmitted to the plasma by waveguides, the source assembly is earthed, which facilitates the integration of such a source type into an industrial process.

The power supplied in this way by the microwave emitter or emitters $P_{VHF}$ is introduced into the enclosure 1 by means of waveguides located at the end of the magnetic mirror.

At low power, the electric $\tilde{E}(\omega_o)$ and magnetic $\tilde{H}(\omega_o)$ fields excited in the guides are essentially perpendicular to the magnetic field direction, which permits the propagation of the wave in the form of the Whistler mode. In the mirror the wave encounters the resonance condition $\omega_o=2\pi f_o=e\ B_{RES}/m$. Close to said zone the wave-electron interaction becomes resonant and a large part of the energy of the wave is transferred to the electrons in the form of kinetic energy perpendicular to the force lines of the magnetic field. As a result of this energy gain, the accelerated electrons are trapped in the magnetic configuration, which increases their free average passage and ensures an effective ionization of the gas in a pressure range which is not accessible to conventional discharges, where the ionization of the gas takes place by the application of a static electric field.

Another advantage of using the Whistler mode is the avoiding of the limitation of the electron density of the plasma ne, due to the space charge by the condition:

$$\omega_o=2\pi f_o<\omega pe=|e^2 ne/\epsilon_o m|^{1/2}$$

For example at a frequency of 2.45 GHz, a power density of 10 to 20 w/cm$^2$ makes it possible to obtain with an argon gas at a pressure of 2 to $5.10^{-4}$ mbar a density close to $10^{12}$ p/cm$^3$, i.e. approximately 10 times the density fixed by the cutoff condition $\omega_o=\omega_p$.

For a higher power, the increase in the density leads to a marked decrease in the phase velocity of the wave in the direction of the magnetic field and the wave propagates perpendicular to the magnetic lines in the form of the lower hybrid mode. For such operating conditions the density of the plasma is fixed by the dispersion relation of the lower hybrid mode defined hereinafter:

$$\omega_0^2 = \frac{\omega_{pi}^2}{1 + \omega_{pe}^2/\omega_{ce}^2} \left[ 1 + \frac{K_{//}}{K} \frac{M_i}{M} \right]$$

in which $\omega_{pe, i}$ are the electron and ion plasma angular frequencies, $\omega_{ce}$ the electron cyclotron angular frequency, m the mass of the electron and the ion, k the wave number and $k_{//}$ its component along the magnetic field. For the example considered hereinbefore at a frequency of 2.45 GHz, a power density of 100 to 200 W/cm$^2$ makes it possible to obtain densities of approximately $10^{13}$ p/cm$^3$, which are not accessible in discharges for the same working pressures.

As the electromagnetic energy is located within the waveguides and at the working pressures of the source, the movement of the particles being linked with the magnetic lines, the dimensions of the plasma generated by each guide are essentially determined by the dimensions of said guide. The contiguous association of guides makes it possible to generate a wave plane perpendicular to the magnetic field over the entire surface of the guides, obtain the resonance condition $2\pi f_o = eB_{RES}/m$ over the entire width of said surface and produce a plasma layer, whose dimensions are fixed by the number of associated guides or the number of guides supplied, as will be explained hereinafter.

Figure 5:
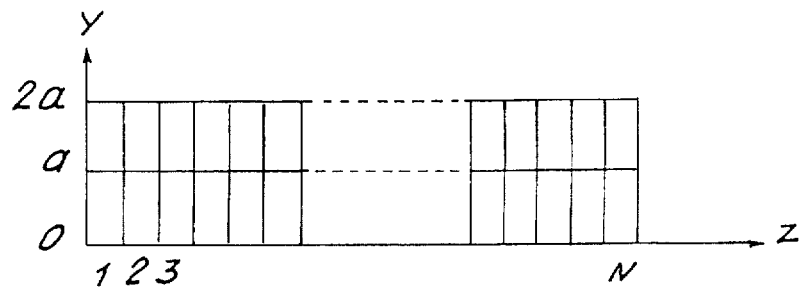

These guides can be associated or joined by their large side a in the form of rows and columns, as shown in FIG. 5. This principle is used for coupling the power in the sources shown in FIGS. 1b/1c and 2b/2c.

Figure 6:
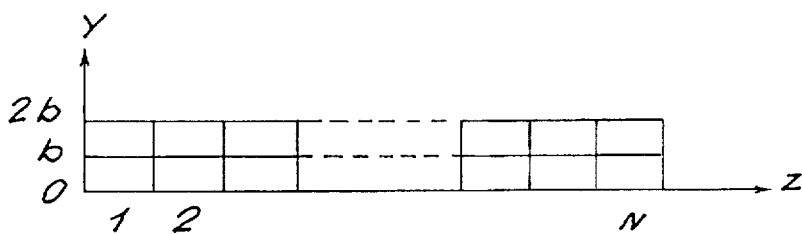
Figure 9:
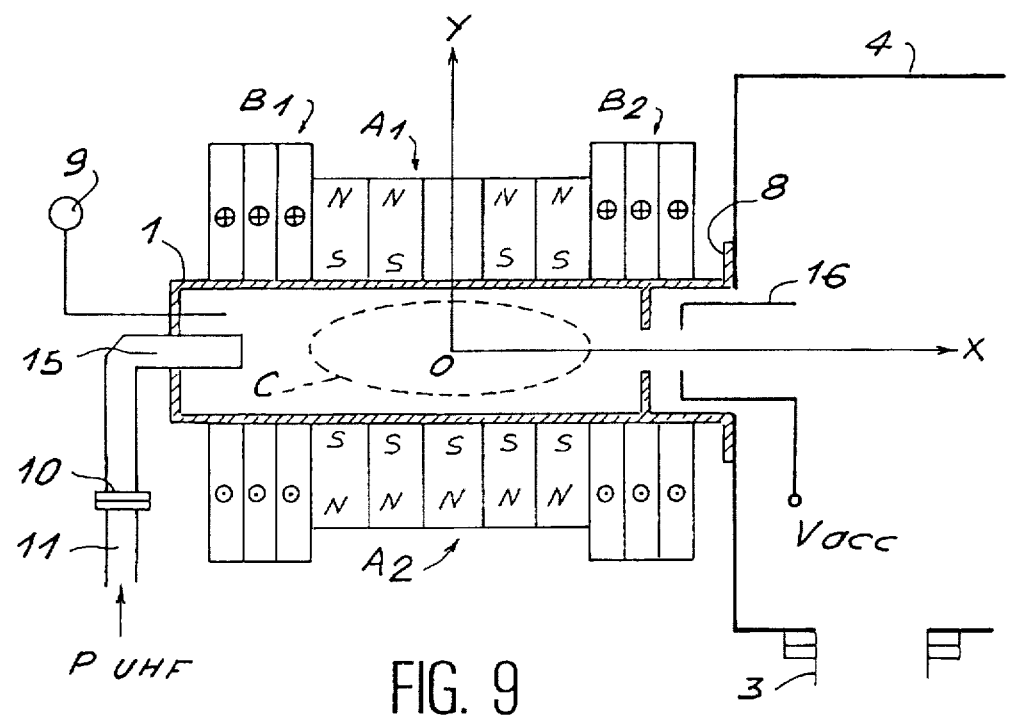
FIG. 9 illustrates a microwave source having a hybrid configuration.

These guides can be associated or joined by their small side b, as shown in FIG. 6. The couplers of the sources shown in FIGS. 7a to 7c, 8a to 8c and 9 use this principle.

This method of associating guides makes it possible to adapt the surface of the plasma layer generated in the source to the dimensions of the parts to be treated and in particular to the case of large parts. For example, at a frequency of 2.45 GHz, an association by the large side of N=24 standard guides (a=8.6 cm, b=4.3 cm) generates a plasma layer of height 8.6 cm and length 100 cm, whilst the association of N=12 of said same guides along the small side generates a layer of the same length and of height 4.3 cm.

The procedure used for uniformly distributing the microwave power between the guides of the coupler is dependent on the application adopted. This power is proportional to the width of the layer and therefore to the dimensions of the parts to be treated. This power can e.g. be supplied by:

- an array of identical, low power emitters $P_{VHF} \approx 1$ KW of the magnetron type, each magnetron supplying via an adapter and tight window one guide of the coupler;
- by an array of identical, medium power emitters $P_{VHF} \approx 5$ KW of the magnetron type, each magnetron supplying several guides of the coupler grouped into identical VHF modules, via an adapter, a planar division E and a tight window;
- a high power emitter $P_{VHF} \approx 50$ KW of klystron type and an equal distribution of said power between the guides of the coupler by conventional division methods by 3 db coupler or branch guide couplers and automatic adaptation.

A preferred embodiment of the source consists of using a coupler with guides associated or joined along their small side according to FIGS. 7a to 7c, 8a to 8c and 9, said solution permitting:

- the reduction of the volume to be magnetized and therefore the volume of the permanent magnets and coils and the price of the source,
- reducing the microwave power to be used,
- facilitating the implementation of the coupler by reducing the number of guides to be associated for treating a given part width,
- facilitating the uniform distribution of the microwave power between the guides of the coupler by supplying each of said guides with a magnetron-type emitter via an adapter or supplying several guides of the coupler grouped into identical VHF modules via a taper E and H followed by a mode converter adapted to the number of guides of the module.

FIGS. 1a to 1c and 2a to 2c show a conventional example of the use of such sources for coating parts by target sputtering. The neutral gas (Ag,Xe, etc.) introduced into the vacuum enclosure is ionized by the wave and forms a plasma layer, whose dimensions are fixed by those of the coupler. In this plasma the electron and ion particles follow magnetic lines and intercept the target over a width fixed by the expansion or opening out of the force lines and over the entire length of the plasma target. The target (Ti, Cr, etc) is electrically insulated from the enclosure. The application of a negative voltage relative to the plasma leads to a bombardment of the target by the ions of the plasma and the emission of a flux of atoms, which are deposited on the part to be treated.

Compared with the magnetron method currently used for this coating process, this type of source offers numerous advantages. The ionization of the gas, the sputtering of the target, the recombination of the target atoms on the part to be treated are very strongly decoupled, which gives a very considerable flexibility in the performance of the process. The ion density $n_i$ in the source is fixed by the gas flow rate $\lceil o$ and the microwave power $P_{VHF}$ and the velocity of the ions $V_i$ bombarding the target by the voltage of the target $V_c$. The deposition rate on the part which is proportional to the ion flux on the target, can thus be controlled independently by means of three parameters $\lceil o$, $P_{VHF}$ and $V_c$. This e.g. makes it possible to optimize the sputtering coefficient of the ions on the target by the target voltage $V_c$ and optimize the density in the source $n_i$ with the parameters $\lceil o$ and $P_{VHF}$. Moreover, in such sources the neutral atoms emitted by the target recombine on the part to be treated in an area not facing the plasma. Therefore, for a constant ion flux supplied by the source, the pressure in the work frame can be lowered by using a differential pumping. The mechanism of ionizing by the wave used permits, for a given ion flux on the target, to operate with lower pressures in the source, which limits the density of the occluded gases in the deposit. The material balance is improved because the entire surface of the target is bombarded by the plasma layer. Moreover, the target can be changed without dismantling the source or passing in front of the ion beam for carrying out a continuous process.

The wave/particle energy transfer fixing the properties of the plasma takes place through the electrons. Thus, these sources operate with all gases, gas mixtures and reactive gases.

To obtain high quality metal deposits, the contamination by impurities can be reduced by using a coupler made at least partly from the material of the target employed.

Moreover, in such sources, the plasma density varies linearly with the VHF power density and can approach $10^{14}$ p/cm$^3$ for a power density of approximately 1 KW/cm$^2$ at a frequency of 2.45 GHz, which corresponds to an ion flux close to $10^{20}$/cm$^2$/s. For such high flux operating conditions, the target, the enclosure, and the coupler must be cooled. In the proposed solution, each of these elements can be cooled by a simple, known procedure of using a double wall with a flow of cooling fluid in the interior, which is controlled in an independent manner and the VHF windows are protected against the bombardment of the plasma.

Figure 2D:
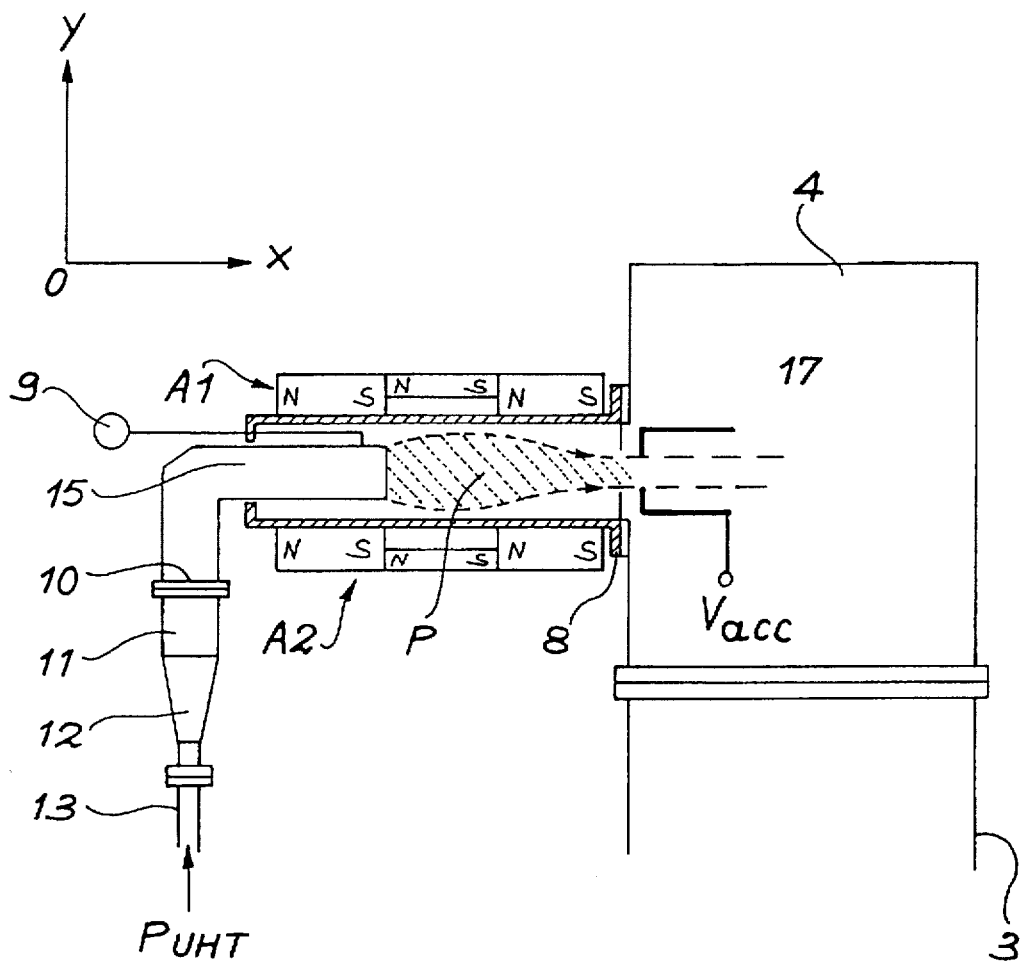

In this source operating mode, the density performances of the plasma layer can be used for generating electron or ion beams. FIG. 2d illustrates a use of said source for producing electron or ion beams. In this case the target is eliminated and replaced by two extraction electrodes, which make it possible as a function of the polarization to extract the ions or the electrons in the form of a linear beam 17, whose length is fixed by that of the coupler.

Another embodiment is represented by cusp-type linear microwave sources. The basic diagram of such a source type used for depositing metal layers on substrates is illustrated in FIGS. 13a to 13c and 14a to 14c. FIGS. 13a to 13c correspond to the case where the magnetic configuration is produced by coils. FIGS. 14a to 14c correspond to the case where it is produced by permanent magnets.

In these drawings, the elements which are identical to those of FIGS. 1a to 1c and 2a to 2c are given the same references.

Such a source uses, as the aforementioned magnetic mirror source, the same wave-based gas ionization mechanism, the same coupling system by associated guides making it possible to obtain a wave plane perpendicular to the magnetic field and the resonance condition $2\pi f_o = B_{RES}/m$ over the entire plasma layer width.

The special nature of this source type is based on the fact that the currents flowing through the coils $B_1$ and $B_2$ (FIG. 13b) or the magnetization vector in the magnet blocks $A_1$ and $A_2$ (FIG. 14b) have opposite signs, which makes it possible to generate a cusp-type linear magnetic configuration. This configuration is characterized by a zero field line on the axis of symmetry of the configuration, a module of the field $B_x^2 + B_y^2 = B^2$ which increases at all points around said axis, four maxima of the field to the right of the coils or magnets, two on the axis Ox, $B_{xMAX}$, two in the median plane of the source $B_{yMAX}$. The coils and magnets are dimensioned so as to satisfy the condition $$B_{xMAX}, B_{yMAX} > B_{RES} = 2\pi f_o m/e$$

over the entire plasma layer width.

Within this condition, the cusp characteristics can vary by acting on the currents in the coils, the distance between the coils or the magnets, by adding metal parts, arranged in the known manner, so as to modify the magnetic field lines.

Figure 7A:
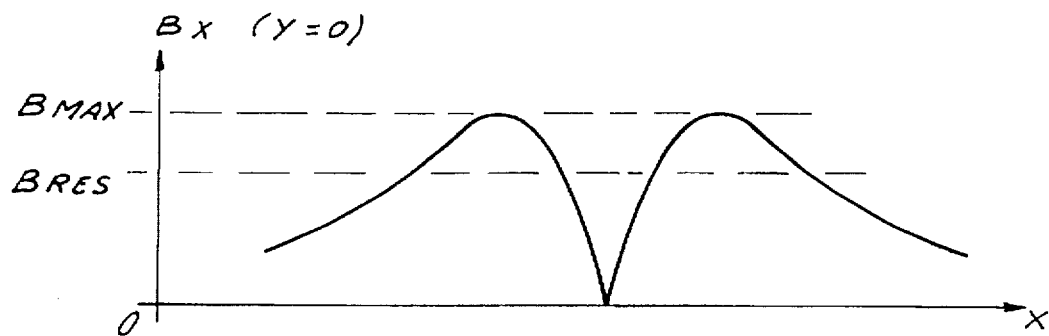
FIGS. 7 to 7c illustrate a cusp source according to the invention in a configuration using coils.
Figure 7B:
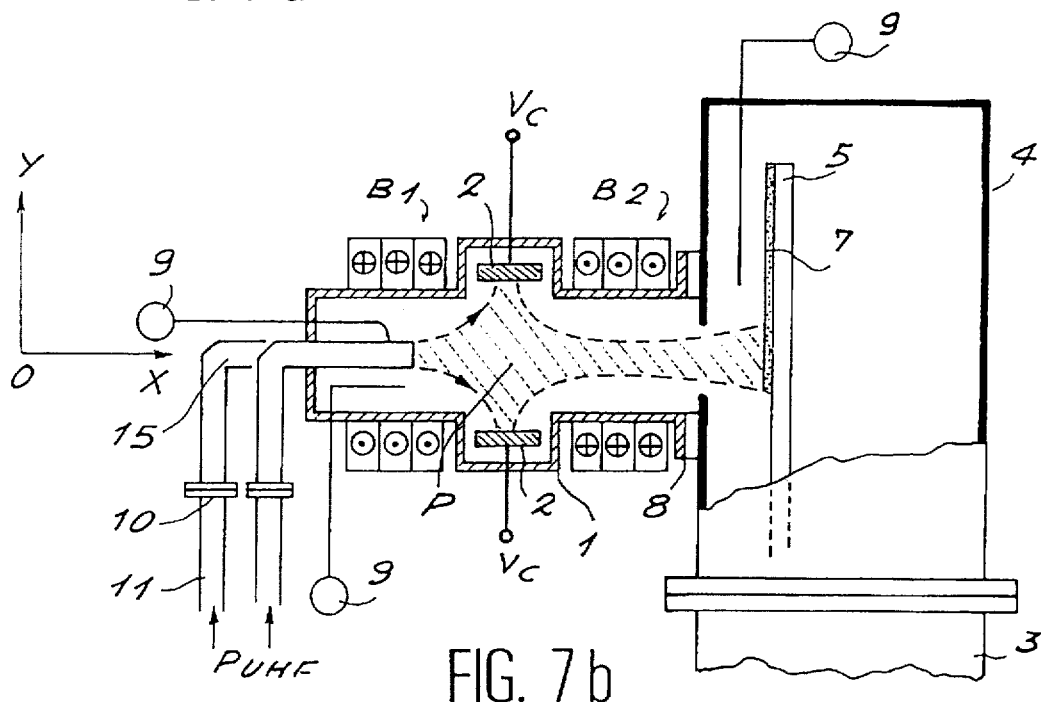
Figure 7C:
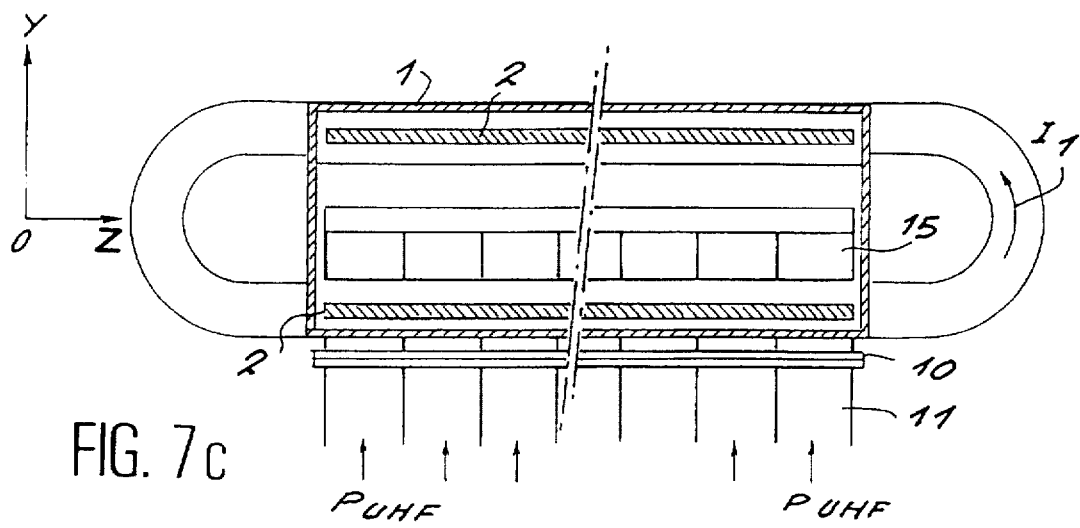
Figure 8:
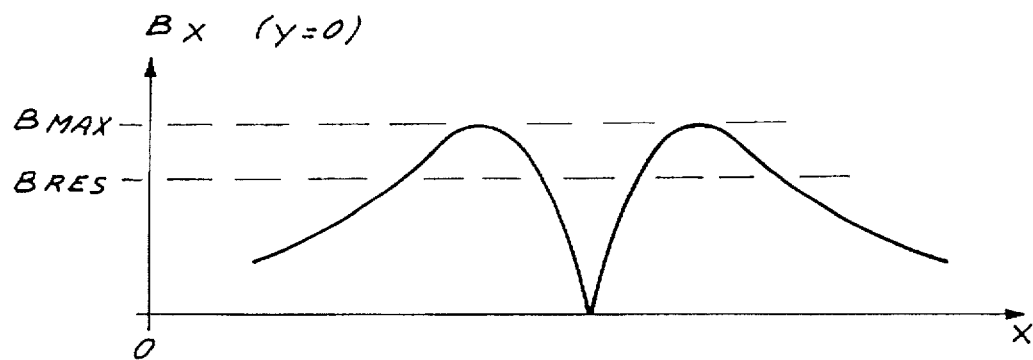
Figure 8:
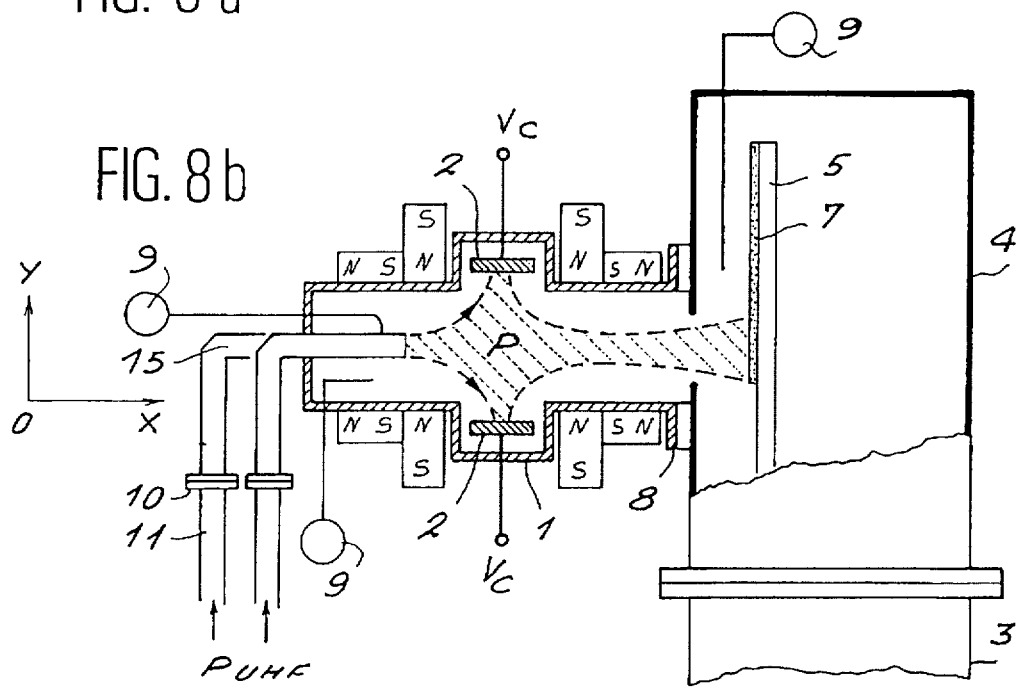
Figure 8:
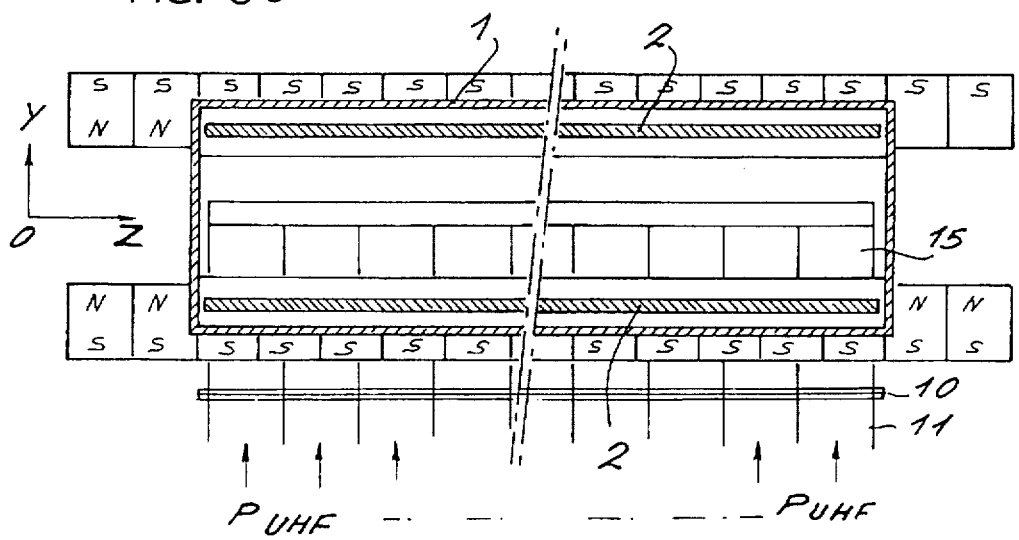

In this configuration, the magnetic field lines from the wave guides of the coupler intercept the two targets 2 placed in the enclosure and are subject to the bombardment of the plasma (FIGS. 7b and 8b). These targets are electrically insulated. The application of a positive potential leads to an ion bombardment of said targets and the emission of a neutral atom flux. On penetrating the plasma, these neutral atoms are ionized by high energy electrons created by the wave and form a plasma of metal ions having the composition of the target. By following the field lines, these ions recombine on the substrate placed at the end of the cusp in order to form a metal deposit, whose width is fixed by the opening out of the magnetic lines and the length by that of the coupler.

Apart from the possibility of producing deposits on large substrates, by its very operating principle this type of source has, compared with other sources which are generally used several significant advantages, namely the ionization mechanism using the wave eliminates pollution of the deposit linked with the use of the emissive cathode and permits an operation of the source at low voltage, which limits the density of the occluded gases and the cusp-type magnetic configuration adds a new possibility of checking the nature and quality of the deposit.

The latter point is an important element with regards to the flexibility of use of such sources. The plasma ensuring the bombardment of the targets 2 and the emission of the atom flux is generated by the ionization by the wave of a carrier gas or metal vapour introduced into the enclosure. The properties of the deposit on the substrate are fixed by the relative concentrations of the different ion species in the plasma and the relative densities of the excited or neutral atoms and free radicals. These concentrations can be controlled by independent settings:

of the ion flux bombarding the targets and which is dependent on the position, the bias voltage and the temperature of the target, or by the density of the magnetic lines intercepted by the target;

the composition, flow rate of the carrier gas or gases and their injection point into the source.

For example, for carbon deposits, the carbon concentration can be controlled by the ion flux on graphite targets, by the choice of the carrier gas in hydrocarbon form (methane, propane, etc.) carbon oxides (CO, $CO^2$, etc.) and the localized independent injection of hydrogen or oxygen.

These sources also operate with refractory material targets, such as oxides of uranium, aluminium, as well as boron and its compounds. In this case, the checking or control of the magnetic configuration makes it possible to vary the density of the magnetic lines intercepted by the targets and therefore the energy density deposited by the plasma and the flow of neutral atoms reemitted by the target. The control of this flow, the flow rate and the nature of the carrier gas (nitrogen, oxygen, etc.) makes it possible to modify the properties of the deposit, as in the case of metal targets.

The absence of an emissive cathode enables the sources to be operated with reactive gases under permanent operating conditions with a remarkable reliability and service life.

Another embodiment is represented by hybrid configuration, linear microwave sources. Such a source, like the cusp or magnetic mirror sources described hereinbefore, uses the same mechanism of ionizing the gas by the wave and the same system of coupling the microwave power with the plasma.

The special nature of this source type is the magnetic configuration. This so-called hybrid configuration shown in FIG. 15 is generated by superimposing a magnetic field with mirror $B_y(x)$ created by the two coils $B_1$ and $B_2$ surrounding the vacuum enclosure and a transverse magnetic field $B_x(y)$ produced by the two permanent magnet blocks $A_1$ and $A_2$ arranged on either side of the vacuum enclosure.

The special property of this configuration is that the location of the points in the plane xOy, where the module of the magnetic field $|B|^2 = [B_x^2 + B_y^2]^{1/2}$ is equal to the resonant magnetic field $|B| = B_{RES} = 2\pi f_o m/e$ is a closed curve C contained within the vacuum enclosure. As the fields $B_x$ and $B_y$ in the volume of the enclosure are independent of the longitudinal direction Oz, the resonance condition $|B| = B_{RES}$ is satisfied on the same closed curve C in all the planes xOy of the vacuum enclosure and therefore on the entire surface obtained by the translation of said curve in the direction Oz.

The existence of this closed resonance surface makes it possible to obtain in such a source a plasma with a very high energy electron population which, by successive ionizations, removes the neutral atoms from the gas or metal vapour introduced into the enclosure. The ions, charged one or more times as a function of the value of the pressure of the gas in the source and which are generated in this magnetic configuration, are extracted from the vacuum enclosure by extraction electrodes located at the end of the mirror in the form of a linear beam, whose length is fixed by that of the coupler.

The properties of the closed resonance surfaces have been successfully used for the production of circular, multi-charged ion beams in magnetic configurations with a symmetry of revolution.

As a result of the use of a linear magnetic configuration and the generation of a layer-type plasma by associating guides according to their large or small side, the present invention generalizes the concept of closed resonance surfaces with symmetry of revolution to linear surfaces and makes it possible to obtain linear ion beams of very large dimensions with high current densities.

The field of application of such sources covers all the conventional applications of ion sources, such as ion implantation, deposition with ion assistance, etc.

The advantage of this type of source is that it makes it possible to perform these processes on an industrial scale as a result of the dimensions and performance characteristics of the beam of generated ions.

We claim:

1. Apparatus for the treatment of a surface with the aid of a particle flux, obtained from the bombardment of a target by a plasma jet, which has a linear microwave source, comprising:
    an enclosure having a first plane of symmetry, extending along a length and a width thereof;
    means ($B_1$, $B_2$; $A_1$, $A_2$) for producing a magnetic field in the enclosure and for generating a plasma layer (P) having a prescribed width and extending along a second plane of symmetry parallel to said first plane of symmetry;
    coupling means between the microwave emission means and the plasma layer in the enclosure;
    at least one target (2) comprising at least one element to be deposited, which is electrically insulated from the enclosure and raised to a bias voltage ($V_c$) relative to the plasma layer (P);
    pumping means (3) for producing a vacuum in the enclosure (1);
    gas injection means (9) for checking the ion species of the plasma layer (P), characterized in that:
    the magnetic field has a plane of symmetry coinciding with that of the plasma layer (P) and that of the enclosure (1); and
    the magnetic field is constant in the direction of the width of the plasma layer, thereby capable of establishing the resonance condition $2\pi f_o = eB_{RES}/m$ over the entire plasma layer width.

2. Apparatus according to claim 1, characterized in that the source assembly is grounded.

3. Apparatus according to claim 1, characterized in that the enclosure (1) is parallelepipedic.

4. Apparatus according to claim 1, characterized in that the means for producing a magnetic field comprise coils ($B_1$,$B_2$) surrounding the enclosure (1).

5. Apparatus according to claim 4, characterized in that the length of the coils ($B_1$,$B_2$) exceeds the length of the enclosure (1) so as to eliminate the edge effects linked with the return of the current.

6. Apparatus according to claim 1, characterized in that the means for producing a magnetic field comprise permanent magnet blocks ($A_1$,$A_2$) positioned on either side of the enclosure (1).

7. Apparatus according to claim 6, characterized in that the permanent magnet blocks ($A_1$,$A_2$) are extended beyond the enclosure (1) in order to prevent edge effects.

8. Apparatus according to claim 1, characterized in that the coupling means comprise identical wave guides associated along their large or small side in order to generate a wave plane perpendicular to the magnetic field and distribute the microwave power uniformly over the plasma layer width.

9. Apparatus according to claim 1, characterized in that the frequency of the electromagnetic field produced within the enclosure is in the range 1 to 10 GHz.

10. Apparatus according to claim 8, characterized in that the wave guides are at least partly made from the same material as the target.

11. Apparatus according to claim 1, characterized in that it has a mirror-type, planar magnetic configuration comprising two coil arrays ($B_1$,$B_2$) of an identical nature traversed by identical currents ($I_1$,$I_2$) flowing in the same direction, or two identical magnet blocks ($A_1$,$A_2$) hollowed out in their central portion and placed on either side of the enclosure (1), the magnetic field having two maxima $B_{MAX}$ and one minimum $B_{MIN}$ located between said maxima, the condition $B_{MAX} > B_{RES} > B_{MIN}$ being satisfied over the entire plasma layer width, $B_{RES}$ being the value of the magnetic field for which the cyclotron angular frequency of the electron is equal to the angular frequency of the electromagnetic wave used for producing the plasma.

12. Apparatus according to claim 1, characterized in that it has a cusp-type, planar magnetic configuration in which the currents ($I_1$,$I_2$) flowing through the coil ($B_1$,$B_2$) or the magnetization vector in the magnet blocks ($A_1$,$A_2$) have opposite signs, the coils and the magnets being dimensioned so as to satisfy the condition $B_{xMAX}$, $B_{yMAX} > B_{RES}$ over the entire plasma layer width.

13. Apparatus according to claim 1, characterized in that it has a hybrid magnetic configuration generated by superimposing a mirror magnetic field produced by the two coils ($B_1$,$B_2$) surrounding the enclosure (1) and a transverse magnetic field produced by two permanent magnet blocks ($A_1$,$A_2$) on either side of the enclosure (1).

14. Apparatus according to claim 1, characterized in that the magnetic configuration generates in the plasma a planar surface where the resonance condition $|B|=B_{RES}$ is satisfied at all points of said surface.

15. Apparatus according to claim 11, characterized in that it is used for producing a surface coating by sputtering.

16. Apparatus according to claim 12, characterized in that it is used for producing a deposit of thin metal films.

17. Apparatus according to claim 13, characterized in that it is used for producing ion assistance and implantation.

18. Apparatus according to claim 13, characterized in that the magnetic configuration generates in the plasma a planar surface where the resonance condition $|B|=B_{RES}$ is satisfied at all points of said surface.

19. Apparatus according to claim 14, characterized in that it is used for producing ion assistance and implantation.

* * * * *